US007043596B2

(12) United States Patent
McWilliams et al.

(10) Patent No.: US 7,043,596 B2
(45) Date of Patent: May 9, 2006

(54) METHOD AND APPARATUS FOR SIMULATION PROCESSOR

(75) Inventors: Thomas M. McWilliams, Menlo Park, CA (US); Jeffrey B. Rubin, Pleasanton, CA (US); Michael W. Parkin, Palo Alto, CA (US); Oyekunle A. Olukotun, Stanford, CA (US); Derek E. Pappas, Union City, CA (US); Jeffrey M. Broughton, Palo Alto, CA (US); David R. Emberson, Santa Cruz, CA (US); David S. Allison, San Ramon, CA (US); Ashley N. Saulsbury, Los Gatos, CA (US); Earl T. Cohen, Fremont, CA (US); Nyles I. Nettleton, Campbell, CA (US); James B. Burr, Foster City, CA (US); Liang T. Chen, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 453 days.

(21) Appl. No.: 10/113,060

(22) Filed: Mar. 29, 2002

(65) Prior Publication Data

US 2003/0040898 A1    Feb. 27, 2003

Related U.S. Application Data

(60) Provisional application No. 60/313,735, filed on Aug. 20, 2001, provisional application No. 60/313,217, filed on Aug. 17, 2001.

(51) Int. Cl.
*G06F 13/00* (2006.01)
*H04L 12/28* (2006.01)

(52) U.S. Cl. .................... 710/317; 370/351

(58) Field of Classification Search ............. 710/317; 703/13, 19; 370/351–365, 384–388, 396–398
See application file for complete search history.

(56) References Cited

U.S. PATENT DOCUMENTS 4,885,684 A    12/1989    Austin et al.

(Continued)

FOREIGN PATENT DOCUMENTS

EP    1 107 116 A2    6/2001

OTHER PUBLICATIONS

C. Ajluni; "Advanced Emulation Tool Targets High-Speed Functional Verification"; vol. 45, No. 5, pp. 80, 82; Mar. 3, 1997; Electronic Design, Penton Publishing, USA.

(Continued)

*Primary Examiner*—Rehana Perveen
*Assistant Examiner*—Nimesh Patel
(74) *Attorney, Agent, or Firm*—Osha Liang LLP

(57) ABSTRACT

A method and apparatus for computation is provided. A main cluster crossbar is connected to a plurality of statically scheduled routing processors. A first sub-cluster crossbar is associated with a first one of the plurality of statically scheduled routing processors where the first sub-cluster crossbar is connected to a first plurality of execution processors. A second sub-cluster crossbar is associated with a second one of the plurality of statically scheduled routing processors where the second sub-cluster crossbar is connected to a second plurality of execution processors.

63 Claims, 6 Drawing Sheets

U.S. PATENT DOCUMENTS

| | | | | |
|---|---|---|---|---|
| 5,175,824 | A | * | 12/1992 | Soderbery et al. .......... 710/317 |
| 5,274,818 | A | | 12/1993 | Vasilevsky et al. |
| 5,566,171 | A | * | 10/1996 | Levinson ..................... 370/352 |
| 6,078,963 | A | * | 6/2000 | Civanlar et al. ............ 709/238 |
| 6,633,945 | B1 | * | 10/2003 | Fu et al. ...................... 710/316 |
| 6,636,933 | B1 | * | 10/2003 | MacLellan et al. ......... 710/317 |
| 6,683,885 | B1 | * | 1/2004 | Sugai et al. ................ 370/423 |
| 6,701,407 | B1 | * | 3/2004 | Honjo et al. ................ 710/317 |
| 6,724,757 | B1 | * | 4/2004 | Zadikian et al. ............ 370/388 |
| 6,725,307 | B1 | * | 4/2004 | Alvarez et al. ............. 710/110 |
| 6,760,870 | B1 | * | 7/2004 | Snyder et al. .............. 714/712 |
| 6,836,815 | B1 | * | 12/2004 | Purcell et al. .............. 710/317 |
| 2002/0095549 | A1 | * | 7/2002 | Matsunami et al. ........ 711/114 |
| 2002/0152060 | A1 | * | 10/2002 | Tseng ........................... 703/17 |
| 2003/0191615 | A1 | * | 10/2003 | Bailey et al. ................. 703/13 |

OTHER PUBLICATIONS

European Search Report dated Apr. 21, 2004 (5 pgs.).

Min-You Wu and Daniel D. Gajski; "*Hypertool: A Programming Aid For Message-Passing Systems*;" Jul. 1990, pp. 330-343, vol. 1, No. 3, IEEE Transactions on Parallel and Distributed Systems.

Jing-Jang Hwang+, Yuan-Chieh Chow+, Frank D. Anger§, and Chung-Yee Lee+; "*Scheduling Precedence Graphs In Systems With Interprocessor Communication Times*;" Apr. 1989, pp. 244-257, vol. 18, No. 2, Siam Journal Computing.

Gilbert C. Sih and Edward A. Lee; "*A Compile-Time Scheduling Heuristic for Interconnection-Constrained Heterogeneous Processor Architectures*;" Feb. 1993, pp. 175-187; vol. 4, No. 2, IEEE Transactions on Parallel and Distributed Systems.

Tao Yang and Apostolos Gerasoulis; "*DSC: Scheduling Parallel Tasks on an Unbounded Number of Processors*;" Sep. 1994, vol. 5, No. 9, IEEE Transactions on Parallel and Distributed Systems.

William J. Dally, J. A. Stuart Fiske, John S. Keen, Richard A. Lethin, Michael D. Noakes, Peter R. Nuth, Roy E. Davison and Gregory A. Pyler; "*The Message-Driven Processor: A Multicomputer Processing Node with Efficient Mechanisms*;" Apr. 1992; pp. 24-39, IEEE Transactions on Parallel and Distributed Systems.

Quickturn Cobalt Webpage; "*Quickturn Boosts Speed, Flexibility In CoBalt 2.0*;" Apr. 20, 1998; pp. 1-4, San Jose, CA.

* cited by examiner

METHOD AND APPARATUS FOR SIMULATION PROCESSOR

CROSS-REFERENCE TO RELATED APPLICATIONS

This application claims benefit of U.S. Provisional Application Ser. No. 60/313,735, filed Aug. 20, 2001, entitled "System Related Inventions," in the names of Thomas M. McWilliams, Jeffrey B. Rubin, Michael Parkin, Oyenkunle Olukotun, Derek Pappas, Jeffrey Broughton, David R. Emberson, Ashley Saulsbury, Earl T. Cohen, William Lam, Liang T. Chen, Ihao Chen, Jay Reynolds, Ankur Narang, David Chenevert, Nyles Nettleton, Tom Riddle, Jim Burr, and David Allison.

This application claims benefit to Provisional Application Ser. No. 60/313,217, filed Aug. 17, 2001, entitled "Phaser System Architecture," and invented by Thomas M. McWilliams; Jeffrey B. Rubin; Derek Pappas; Kunle Olukotun; Jeffrey Broughton; David R. Emberson; William Lam; Liang T. Chen; Ihao Chen; Earl T. Cohen; and Michael Parkin.

BACKGROUND OF INVENTION

The invention relates to simulation of microprocessor performance. Modern high performance microprocessors have an ever-increasing number of circuit elements and an ever-rising clock frequency. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a design perspective, important considerations such as the time needed to complete a simulation and the time needed to debug a CPU must be taken into account.

As each new CPU design uses more circuit elements, each often operating at increased frequencies, the time required to simulate the design increases. Due to the increased time for simulation, the number of tests, and consequently the test coverage, decreases. In general, the result has been a dramatic increase in the logic errors that escape detection before the CPU is manufactured.

After a CPU prototype is initially manufactured and failure modes are uncovered, the time required to determine failure mechanisms is generally increasing due to the increased CPU complexity. Failure modes may be the result of logic errors or poor manufacturability of a circuit element. In both cases, circuit simulation helps to confirm or refute the existence of a logic error. If a logic error does not exist, the manufacturability of a circuit element may be the root cause. Even after a logic error failure mechanism is discovered and a solution is proposed, the time required to satisfactorily determine that the proposed solution fixes the logic error and does not generate any new logic errors has increased. Circuit simulation is key to the design and debugging of increasingly complex and faster CPUs.

CPU simulation may occur at a "switch-level." Switch-level simulations typically include active circuit elements (e.g., transistors) and passive circuit elements (e.g., resistors, capacitors, and inductors). A typical switch-level circuit simulator is "SPICE", which is an acronym for Simulation Program with Integrated Circuit Emphasis. SPICE typically models each element using an equation or lookup table. SPICE can model accurately the voltage and/or current of each circuit element across time.

CPU simulation also may occur at a "behavioral level." Behavioral level simulations typically use a hardware description language (HDL) that determines the functionality of a single circuit element or group of circuit elements. A typical behavioral level simulation language is "Verilog", which is an Institute of Electrical and Electronics Engineers standard. Verilog HDL uses a high-level programming language to describe the relationship between the input and output of one or more circuit elements. The Verilog HDL describes on what conditions the outputs should be modified and what effect the inputs have. Verilog HDL programs may also be used for logic simulation at the "register transfer level" (RTL).

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, and pass transistors (switches).

HDL languages such as Verilog are designed for efficient representation of hardware designs. Verilog has support for handling signals of arbitrary widths, not only for defining and using an arbitrary width signal, but for treating any sub-field of such a signal as a signal in its own right.

Cycle-based logic simulation is applicable to synchronous digital systems and may be used to verify the functional correctness of a digital design. Cycle-based simulators use algorithms that eliminate unnecessary calculations to achieve improved performance in verifying system functionality. Typically, in a cycle-based logic simulator the entire system is evaluated once at the end of each clock cycle. Discrete component evaluations and re-evaluations are typically unnecessary upon the occurrence of every event.

HDL simulations may be event-driven or cycle-based. Event-driven simulations propagate a change in state from one set of circuit elements to another. Event-driven simulators may record relative timing information of the change in state so that timing and functional correctness may be verified. Cycle-based HDL simulations also simulate a change in state from one set of circuit elements to another. Cycle-based HDL simulations, however, evaluate the state of the system once at the end of each clock cycle. While specific intra-cycle timing information is not available, simulation speed is improved.

HDL simulations may be executed on reconfigurable hardware, such as a field programmable gate array (FPGA) chip. The FPGA allows dedicated hardware to be configured to match the HDL code. FPGA hardware provides a method to improve the simulation time. As the design changes, the time required to reconfigure the FPGA arrangement may prohibit many iterations. Also, the number of FPGA chips required for complex designs may be relatively large.

HDL simulations also may be executed on general purpose processors. General purpose processors, including parallel general purpose processors, are not designed specifically for HDL simulations. HDL simulations require a large number of operations of inputs and outputs that use bit-wise operations.

Large logic simulations are frequently executed on parallel or massively parallel computing systems. For example, parallel computing systems may be specifically designed parallel processing systems or a collection, or "farm," of connected general purpose processing systems. FIG. 1 shows a block diagram of a typical parallel computing system (100) used to simulate an HDL logic design. Multiple processor arrays (112, 113, 129) are available to simulate the HDL logic design. A host computer (116), with associated data store (117), controls a simulation of the logic design that executes on one or more of the processor arrays (112, 113, 129) through an interconnect switch (118). The processor arrays (112, 113, 129) may be a collection of processing elements or multiple general purpose processors. The interconnect switch (118) may be a specifically designed interconnect or a general purpose communication system, for example, an Ethernet network.

A general purpose computer (120) with a human interface (122), such as a GUI or a command line interface, together with the host computer (116) support common functions of a simulation environment. These functions typically include an interactive display, modification of the simulation state, setting of execution breakpoints based on simulation times and states, use of test vectors files and trace files, use of HDL modules that execute on the host computer and are called from the processor arrays, check pointing and restoration of running simulations, the generation of value change dump files compatible with waveform analysis tools, and single execution of a clock cycle.

SUMMARY OF INVENTION

According to one aspect of the present invention, an apparatus for computation comprises a main cluster crossbar connected to a plurality of statically scheduled routing processors, a first sub-cluster crossbar associated with a first one of the plurality of statically scheduled routing processors where the first sub-cluster crossbar is connected to a first plurality of execution processors, and a second sub-cluster crossbar associated with a second one of the plurality of statically scheduled routing processors where the second sub-cluster crossbar is connected to a second plurality of execution processors.

According to one aspect of the present invention, a method of routing information in a multiprocessor system comprises employing a main cluster crossbar to communicate with a plurality of statically scheduled routing processors, employing a first sub-cluster crossbar to communicate with a first plurality of execution processors where the first sub-cluster crossbar communicates with the main cluster crossbar via a first one of the plurality of statically scheduled routing processors, and employing a second sub-cluster crossbar to communicate with a second plurality of execution processors where the second sub-cluster crossbar communicates with the main cluster crossbar via a second one of the plurality of statically scheduled routing processors.

Other aspects and advantages of the invention will be apparent from the following description and the appended claims.

DETAILED DESCRIPTION

Figure 1:
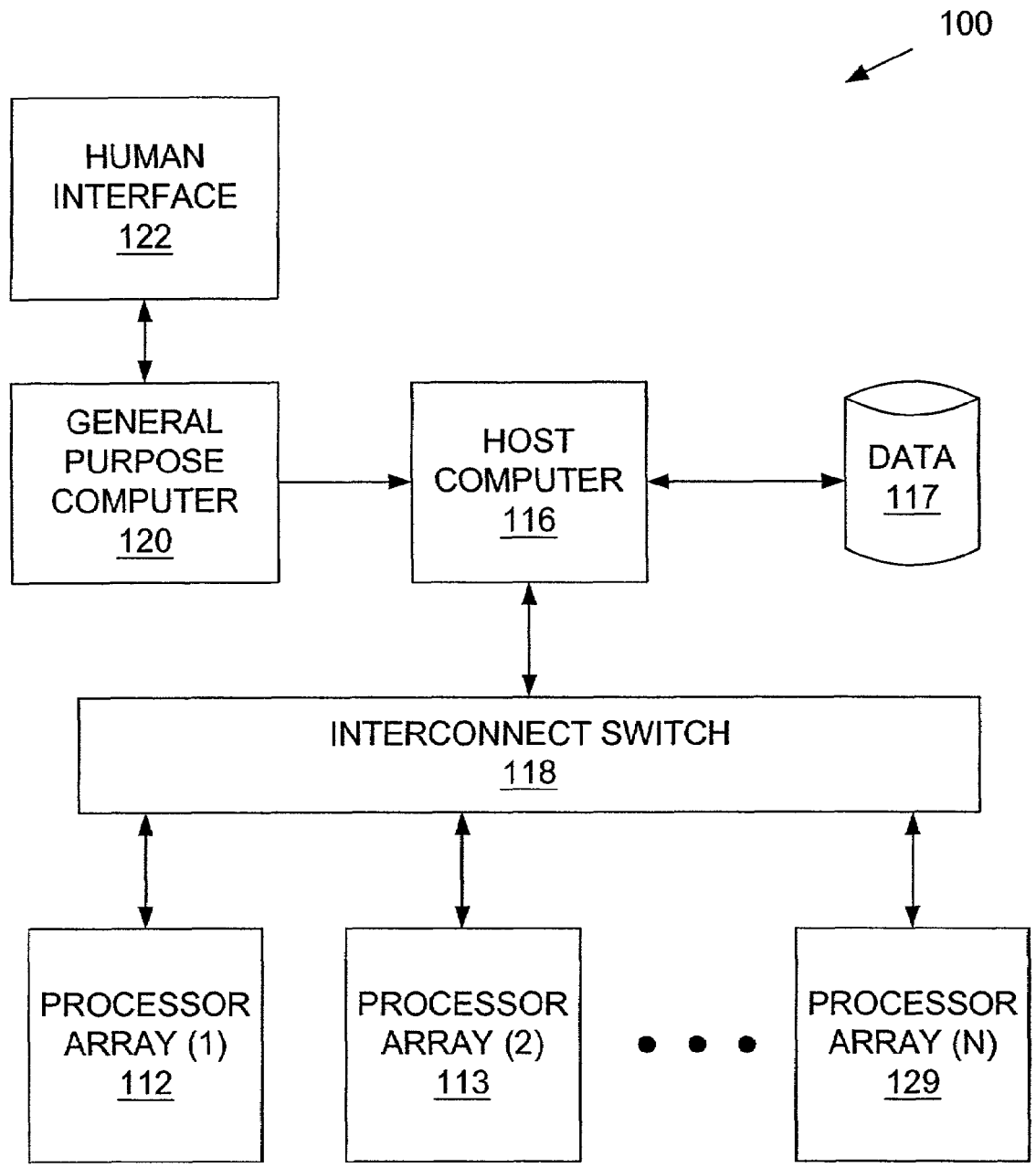
FIG. 1 shows a typical parallel computer system.

Embodiments of the present invention relate to an apparatus for computation. Embodiments of the present invention further relate to a method of routing information in a multiprocessor system. Embodiments of the present invention also relate to a means for routing information in a multiprocessor system.

More particularly, embodiments of the present invention relate to a main crossbar with multiple terminal points. Each terminal point is associated with a routing processor (RP) and one or more functional elements. Functional elements include, but are not limited to, input/output buffers, memory access, register file unit, global control register file unit, and sub-cluster crossbars. Sub-cluster crossbars connect multiple processing elements. Each routing processor is statically scheduled and provides a communication path between the functional element and the main cluster crossbar. This arrangement allows a hierarchical, scalable multiprocessor architecture.

Exemplary embodiments of the invention will be described with reference to the accompanying drawings. Like items in the drawings are shown with the same reference numbers.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

The system of the invention is a massively parallel, cycle-bused computing system. The system uses an array of execution processors arranged to perform cycle-based computations. One example of cycle-based computation is simulation of a cycle-based design written in a computer readable language, such as HDL (e.g., Verilog, RTL, etc.), or a high-level language (e.g., Occam, Modula, C, etc.).

Figure 2:
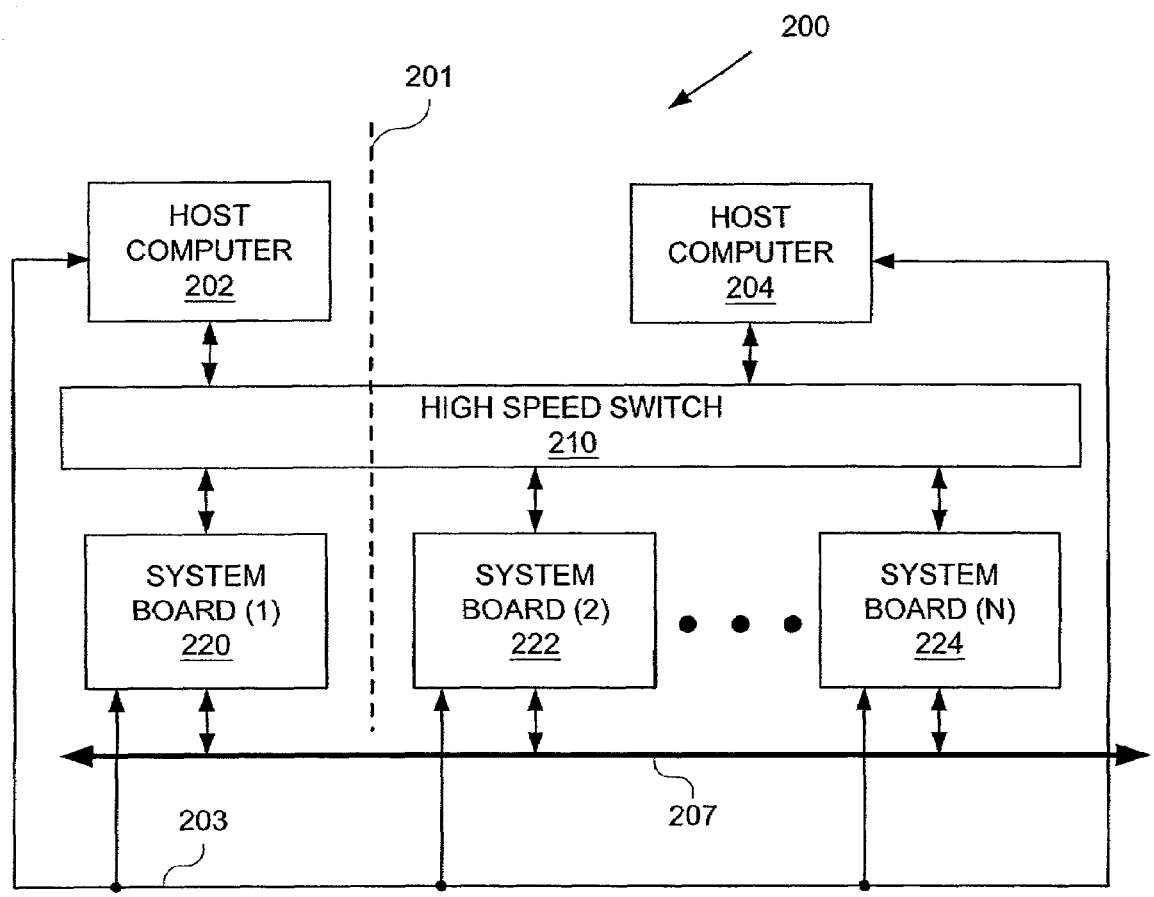
FIG. 2 shows a parallel computer system in accordance with an embodiment of the present invention.

FIG. 2 shows exemplary elements of a system (200), in accordance with one or more embodiments of the present invention. Cycle-based computation, such as a logic simulation on the system (200), involves one or more host computers (202, 204) managing the logic simulation(s) executing on one or more system boards (220, 222, 224). Each system board contains one or more Application Specific Integrated Circuits (ASIC). Each ASIC contains multiple execution processors. The host computers (202, 204) may communicate with the system boards (220, 222, 224) using one of several pathways. The host computers (202, 204) include interface hardware and software as needed to manage a logic simulation. A high speed switch (210) connects the host computers (202, 204) to the system boards (220, 222, 224). The high speed switch (210) is used for loading and retrieval of state information from the execution processors located on ASICs on each of the system boards (220, 222, 224). The connection between the host computers (202, 204) and system boards (220, 222, 224) also includes an Ethernet connection (203). The Ethernet connection (203) is used for service functions, such as loading a program and debugging. The system also includes a backplane (207). The backplane (207) allows the ASICs on one system board to communicate with the ASICs of another system board (220, 222, 224) without having to communicate with an embedded controller located on each system board. Additional system boards may be added to the system by connecting more system boards to the backplane (207).

The system boards may be divided into simulation domains. Simulation domains are independent and are divided by a simulation domain boundary (201). For example, system board one (220) may be used to simulate a first cycle-based simulation that is loaded, accessed, and monitored by host computer (202) resulting in one simulation domain. System board (222) through system board (224) may be used to simulate a second cycle-based simulation that is loaded, accessed, and monitored by host computer (204) resulting in another simulation domain. The boundary dividing these two simulation domains is referred to as the simulation domain boundary (201). The simulation domain boundary (201) may include any number of system boards, as needed. In accordance with one embodiment of the present invention, there may exist only one system board within the boundary. In other embodiments of the invention, there may exist multiple system boards within the boundary.

Figure 3:
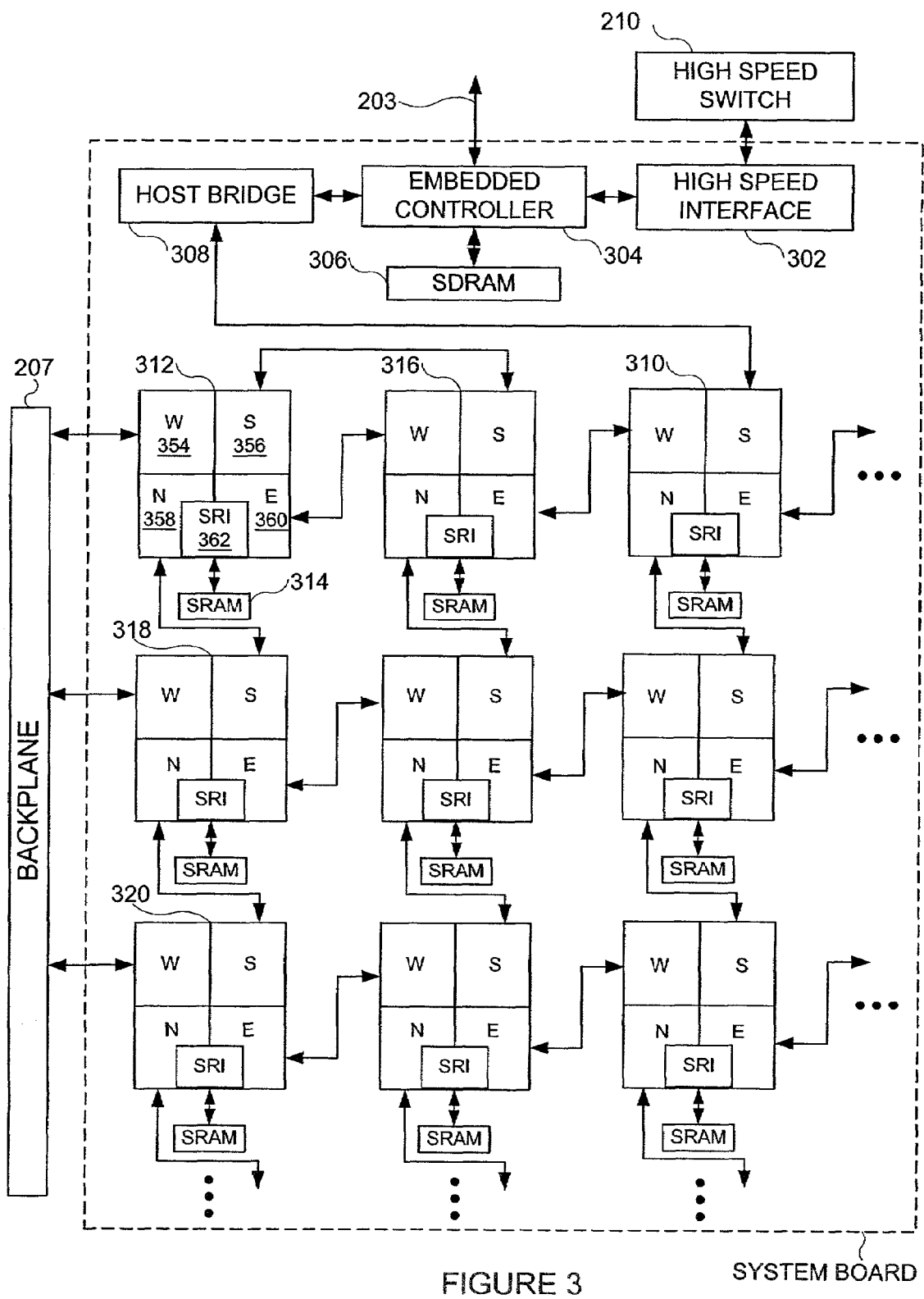
FIG. 3 shows a system board block diagram in accordance with an embodiment of the present invention.

FIG. 3 shows a block diagram of a system board in accordance with one or more embodiments of the present invention. The system board is representative of any of the system boards (e.g., system board (220, 222, 224)) shown in FIG. 2. The system board may include multiple ASICs. Each ASIC is connected via a two-dimensional mesh. Each ASIC has four input/output buffers referenced as North (N), South (S), East (E), and West (W). For example, an ASIC (312) has four input/output buffers N (358), S (356), E (360) and W (354). Each ASIC connects to other ASICs using the four input/output buffers, one for each neighboring ASIC. An edge ASIC may connect to other edge ASIC to create a secondary connection. For example, ASIC (312) and ASIC (316) connect using the E and W input/output buffers, respectively, and using their respective S input/output buffers. Another possible connection for edge ASICs is a connection to the backplane (207), which connects to other system boards. For example, ASICs (312, 318, 320) connect to the backplane, each using their respective W input/output buffers. Each ASIC may also connect to external memory in the form of static random access memory (SRAM) through a SRAM interface (SRI). For example, ASIC (312) connects to SRAM (314) through SRI (362).

One ASIC on each system board is used as an operative connection to an embedded controller. For example, ASIC (310) uses its S input/output buffer to connect to an embedded controller (304) through a host bridge (308). The embedded controller (304) connects to an Ethernet network (203), associated memory in the form of a synchronous dynamic random access memory (SDRAM) (306), and a high speed switch interface (302). The high speed switch interface (302) connects to the high speed switch (210). The SDRAM (304) may store instructions for the embedded controller (304).

Figure 4:
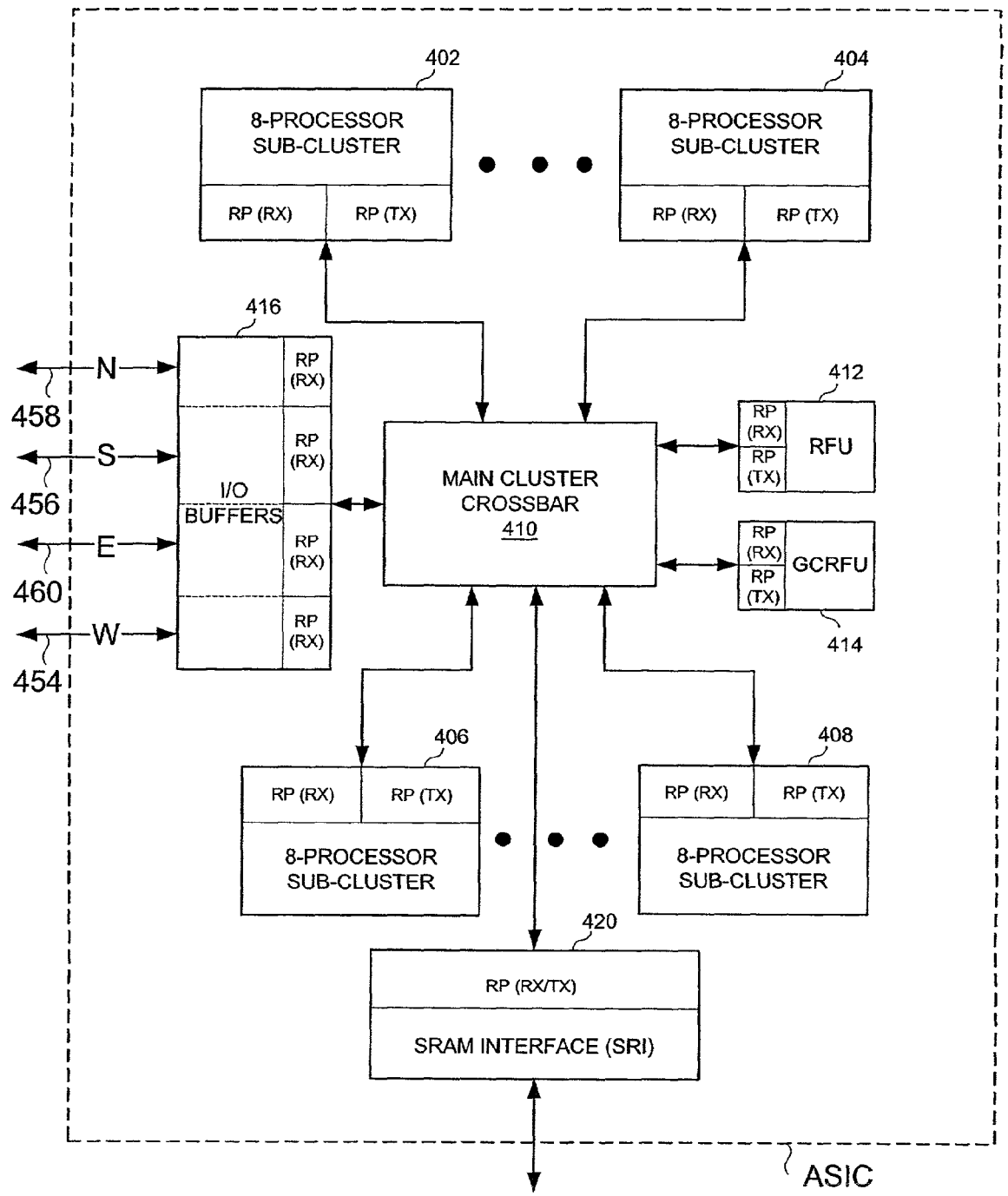
FIG. 4 shows an application specific integrated circuit block diagram in accordance with an embodiment of the present invention.

In accordance with one or more embodiments of the present invention, a block diagram of an ASIC is shown in FIG. 4. The ASIC is representative of any of the ASICs (e.g., ASIC (310, 312, 316, 318, 320)) shown in FIG. 3. A main cluster crossbar (410) connects to multiple terminal points. Each terminal point has at least one statically scheduled routing processor (RP) connected to at least one functional element. The main cluster crossbar (410) enables message passing and communication of information on the ASIC. For example, the main cluster crossbar (410) connects to a statically scheduled routing processor that is associated with each of the input/output buffers (416), such as input/output buffer N (458). Other terminal points include, but are not limited to, additional input/output buffers (456, 460, 454), 8-processor sub-clusters (402, 404, 406, 408) that includes 8 processors connected by a sub-cluster crossbar, a SRI (420), a register file unit (RFU) (412), and a global control register file unit (GCRFU) (414).

In one or more embodiments of the present invention, each input/output buffer is associated with a statically scheduled routing processor that is arranged to receive (RX) information from another input/output buffer on a different ASIC. Alternate connections may include one of the input/output buffers communicating with the embedded controller (304) through the host bridge (308) or one of the input/output buffers connected to the backplane (207), as described previously. The RFU (412) is associated with two statically scheduled routing processors to simultaneously send (TX) and receive (RX) information for temporarily parking messages routed on the main cluster crossbar. The GCRFU (414) is also associated with two statically scheduled routing processors to simultaneously send and receive information for temporarily parking messages routed on the main cluster crossbar and global control information, such as a broadcast tree arbiter to store messages and control functions. The SRI (420) is associated with a single statically scheduled routing processor that both sends and receives information; however, the send or receive operation is not arranged to occur simultaneously. The SRI (420) provides an interface to external memory and may be accessed by the execution processors in the sub-clusters (402, 404, 406, 408) through the main cluster crossbar (410). Each 8-processor sub-cluster (402, 404, 406, 408) is associated with two statically scheduled routing processors, one to receive and one to send information simultaneously. Each statically scheduled routing processor is associated with a routing table to determine when and where the routing processor should send or receive information. Because the routing is determined a priori, a destination or origination address is not required in the transferred information. However, a tag identification is transferred with the information. The tag identification provides an arrangement to check that the received information occurred during the proper cycle. Each statically scheduled routing processor checks the tag identification to maintain proper operation of the system. Also, to ensure that no bit errors occurred during transmission, each statically scheduled routing processor may have an error correction mechanism to fix a limited number of bit errors.

Figure 5:
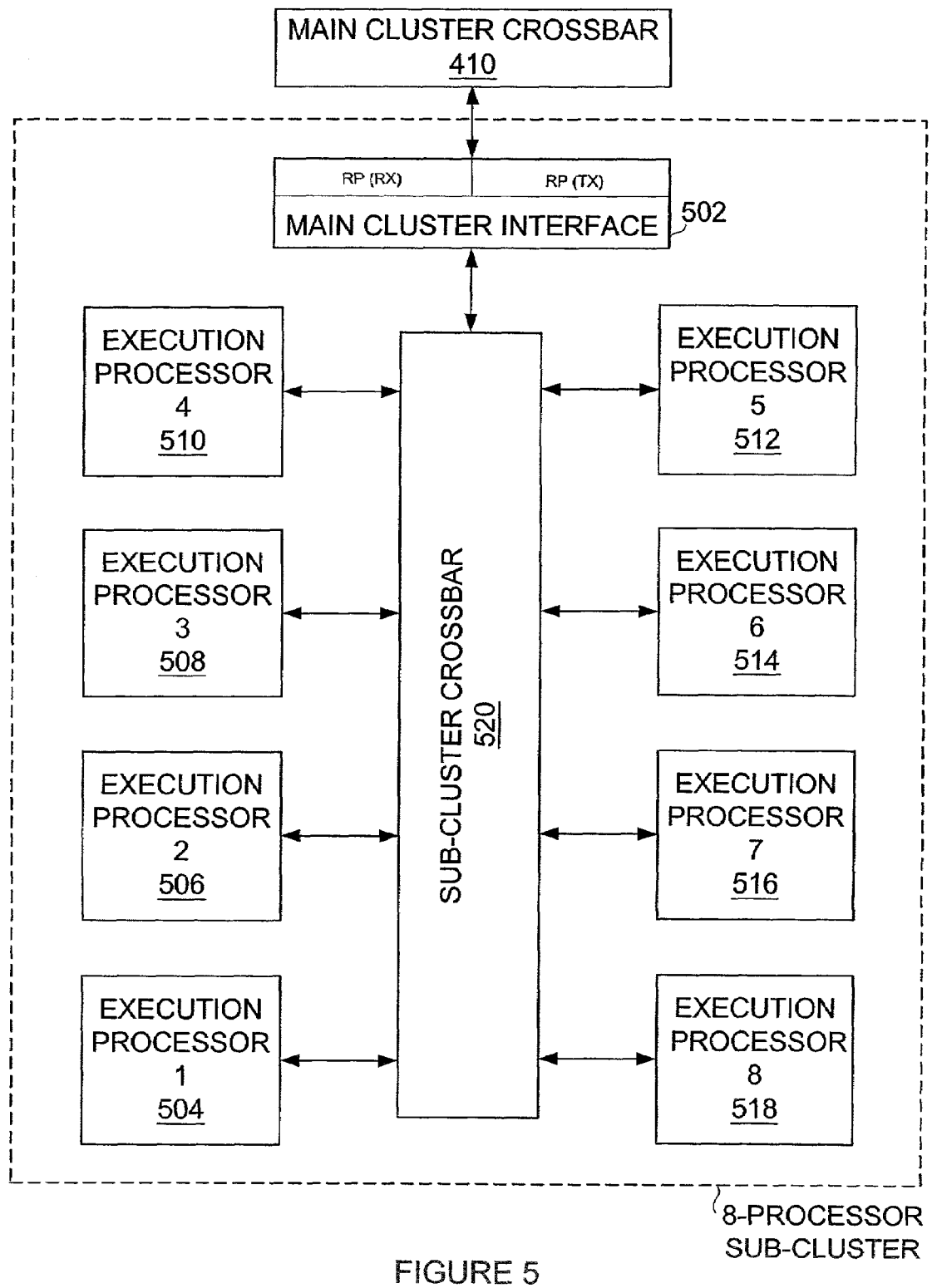
FIG. 5 shows a sub-cluster processor block diagram in accordance with an embodiment of the present invention.

In accordance with one or more embodiments of the present invention, an 8-processor sub-cluster is shown in FIG. 5. The 8-processor sub-cluster is representative of any of the 8-processor sub-cluster (e.g., 8-processor sub-cluster (402, 404, 406, 408)) shown in FIG. 4. The 8-processor sub-cluster has a sub-cluster crossbar (520) that connects to eight execution processors (504, 506, 508, 510, 512, 514, 516, 518) that perform cycle-based computation. The execution processors are capable of executing custom instructions that enable cycle-based computations, such as specific logic operations (e.g., four input, one output Boolean functions), and control instructions, such as a "synchronization" instruction that stalls an execution processor until all execution processors are ready to resume. The sub-cluster crossbar (520) is associated with a main cluster interface (502) that contains two statically scheduled routing processors to send and receive information simultaneously. The main cluster interface (502) transfers information over the main cluster crossbar (410).

The execution processors (504, 506, 508, 510, 512, 514, 516, 518) are capable of executing simulation instructions. Those skilled in the art will appreciate that the execution processors (504, 506, 508, 510, 512, 514, 516, 518) may natively execute a design logic instruction translated from the simulation source code. The simulation source codes include, but are not limited to, RTL designs in Verilog, some other HDL, and high level languages. The execution of instructions on the execution processors (504, 506, 508, 510, 512, 514, 516, 518) is temporally synchronized by a global clock. To maintain coherent transmission of information across multiple execution processors, the execution processors transmit and receive the tag identification along with information.

Figure 6:
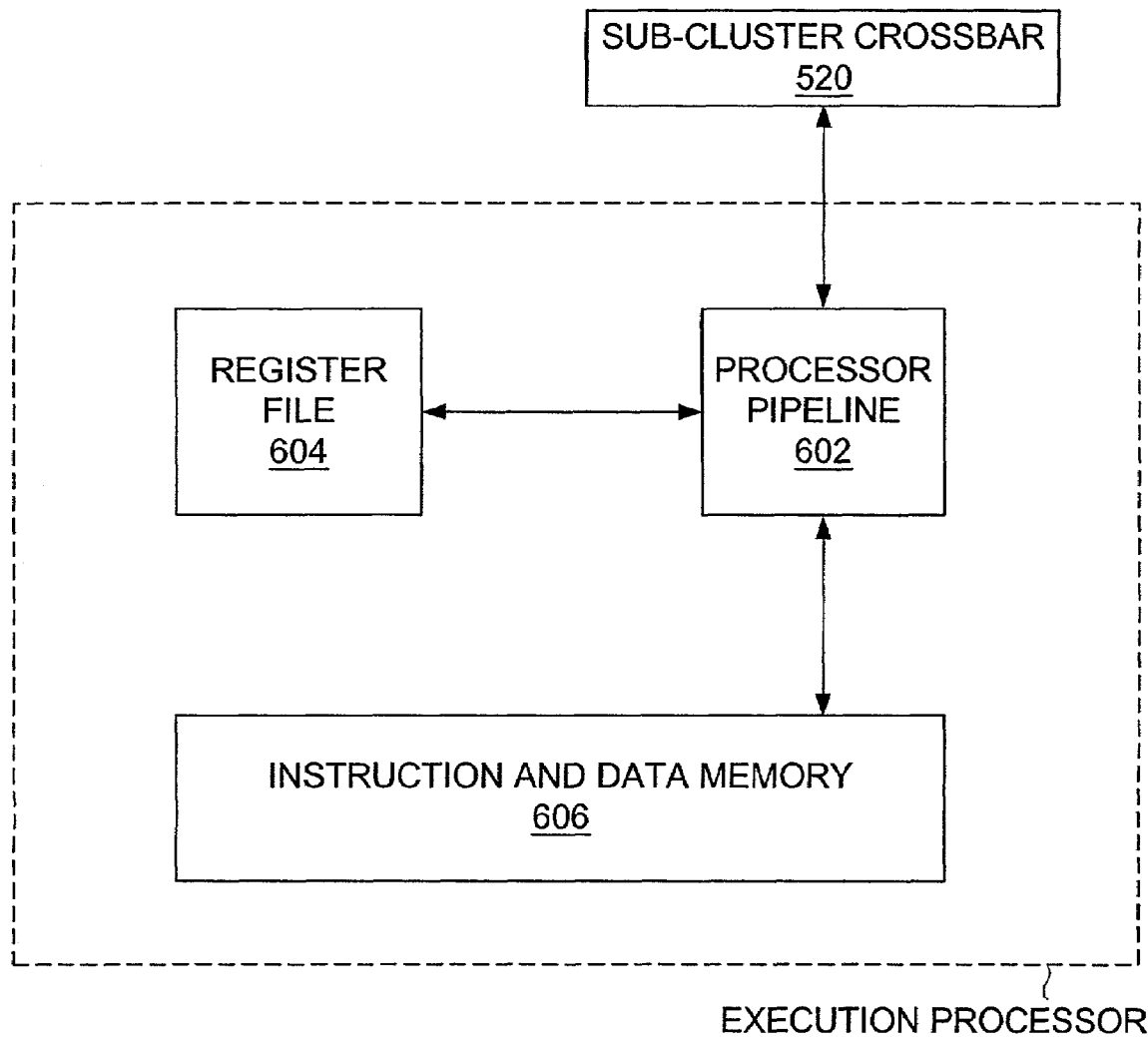
FIG. 6 shows an execution processor block diagram accordance with an embodiment of the present invention.

FIG. 6 shows an execution processor in accordance with one or more embodiments of the present invention. The execution processor is representative of any of the execution processors (e.g., execution processor (504, 506, 508, 510, 512, 514, 516, 518)) shown in FIG. 5. The execution processor has three main elements: a multi-stage processor pipeline (602), a register file (604), and instruction and data memory (606). The processor pipeline (602) may access both the register file (604) and the instruction and data memory (606). The register file (604) contains values that are operated on by the instructions stored in the instruction and data memory (606). The register file (604) is bit addressable by the processor pipeline (602) and supports arbitrary width Verilog operations without packing and unpacking bit fields; therefore, the register file (604) has inherent message packing. The instruction and data memory (606) stores instructions and data that are used by the processor pipeline (602) to execute some part of a cycle-based simulation. The processor pipeline (602) is a multi-stage pipeline, of which one of the stages in an execution unit. The execution unit is capable of executing general and simulation specific instructions. It is also designed to respond to system specific control instructions. The processor pipeline (602) also connects to a sub-cluster crossbar (520), as does 7 other processor pipelines. Each processor pipeline (602) has an error correction mechanism to fix a limited number of bit errors that might occur in received information.

The execution processors operate in one of two modes: run mode or control mode. Run mode is used to perform computations for cycle-based simulations. Control mode is used to observe and control the operation of the system (e.g., configuration and initialization, processing user and system task calls, diagnostics, etc.).

For example, if the system simulates a digital logic design that must be simulated for many cycles, the control mode may initialize and configure the execution processors and routing tables for the statically scheduled routing processor. Different components of the logic design may be simulated on different execution processors. Also, the time required to complete each component may be different. The run mode allows execution of the cycle-based simulation instructions stored in the instruction and data memory (606) of each execution processor. Information is passed between execution processors by using a hierarchical communication arrangement. Information on one execution processor may be sent through the main cluster crossbar (410) by a routing processor (not shown) in the main cluster interface (502). To get to the main cluster interface (502), the information from the execution processor must traverse its local sub-cluster crossbar. Depending on the predetermined destination, the information may remain on the same ASIC by traversing the main cluster crossbar (502), to another main cluster interface, then another sub-cluster crossbar, to another processor pipeline (602).

The information may also require, for example, that it be passed from ASIC (312) to ASIC (320) to reach its final destination. Once the information is sent through the main cluster crossbar (410), it is sent through the proper input/output buffer to the next ASIC. In this example, the information flows out of N (358) on ASIC (312) into the S input/output buffer on ASIC (318). The information, under direction of the routing processor associated with the S input/output buffer in ASIC (318), routes the information through the main cluster crossbar in ASIC (318) out the N input/output buffer on ASIC (318). The information is then received on the S input/output buffer on ASIC (320). The information, under direction of the routing processor associated with the S input/output buffer in ASIC (320), routes the information through the main cluster crossbar in ASIC (320). The information routes through the main cluster crossbar (410) of ASIC (320), to the receive routing processor in the main cluster interface (502) of the appropriate 8-processor sub-cluster. From there, the information is routed to the proper execution processor through the sub-cluster crossbar (520) of the appropriate 8-processor sub-cluster. The routing processors along this path are all statically determined. Each routing processor also verifies the tag identification associated with the routed information to ensure proper system operation.

At the completion of one simulation cycle for all the components of the logic simulation, the host computer (204) checks a set of bits for any errors that may have occurred during the previous simulation cycle. An attention tree uses a logical OR operation from a set of bits from each execution processor or other functional elements to create the set of bits the host examines. Any toggled bit in the set of bits means that one or more execution processors and/or other functional elements require attention. If no bits are toggled, another simulation cycle occurs in run mode. If any bits are toggled, the control mode is entered. The host computer (204) may poll each execution processor to determine which execution processor or other functional elements require corrective action.

in the control mode, the host computer (204) may communicate with any execution processor through the embedded controller (304) on each system board. The embedded controller (304) communicates through the host bridge (308) to one ASIC (310). Any control mode commands are propagated from ASIC to ASIC because the host computer configures each ASIC to have a parent link to a neighboring ASIC. Communication from the embedded controller (304) to an ASIC other than ASIC (310) does not require use of the main cluster crossbar (410) on ASIC (310). Information from the embedded controller (304) only uses the input/output buffers on ASIC (310) to communicate to other ASICs. Any further ASIC to ASIC communication involves the main cluster crossbar of each ASIC as described above. Once the host computer has identified and resolved the error, run mode is again entered to perform another simulation cycle.

Those skilled in the art will appreciate that the system has both a run mode and a control mode, both of which have distinct purposes and connectivity. The run mode allows the execution processors, and more specifically, the execution unit of the processor pipeline, to generate a cycle-based computation. Continued computation may involve passing information from one execution processor to another. The routing of information may occur within a single, 8-processor sub-cluster. The routing of information may occur within the same ASIC and route through the main cluster crossbar. The routing of information may occur across multiple ASICs and route through multiple input/output buffers and main cluster crossbars. The routing of information in run mode is enabled by statically scheduled routing processors. All statically scheduled routing processors have all the routing information stored in routing tables before run mode is entered. The control mode accesses multiple execution processors by using the connectivity of the run mode (in-band connections) and also out-of-band connections to indicate that the control mode has been entered. The combination of both the in-band and out-of-band connections forms a control network. The control mode allows the state of the execution processors to be accessed. The state of the execution processors may be initialized before the initial run mode is started. Also, the state of the execution processors may be retrieved, analyzed, and possibly altered if one or more execution processors require attention.

As mentioned previously, an attention tree indicates that one or more execution processors requires attention. The attention tree logically ORs the attention bits from multiple execution processors and other functional elements (e.g., a routing processor) to provide a small set of bits for the host computer to analyze. Determining which execution processor(s) requires attention is determined by polling using the control network.

In accordance with embodiments of the invention, all the execution processors, routing processors, and other functional elements are synchronized by a global clock.

Advantages of the present invention include one or more of the following. The invention provides a cycle-based simulation system that allows high-speed simulation, permitting adequate design resources and test coverage. The system provides large capacity so that entire designs and systems can be tested, and allows for fast reconfiguration due to its modularity. The simulation hardware is scalable so that it can keep pace with emerging complex and high device count logic designs. Additional ASICs and/or system boards may be added to increase the capacity of the system. Those skilled in the art appreciate that the present invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system board comprising:
a first main cluster crossbar connected to a first plurality of statically scheduled routing processors, wherein the first plurality of statically scheduled routing processors are statically scheduled using routing information stored prior to run mode;
a first sub-cluster crossbar associated with a first one of the first plurality of statically scheduled routing processors, wherein the first sub-cluster crossbar is connected to a first plurality of execution processors; and
a second sub-cluster crossbar associated with a second one of the first plurality of statically scheduled routing processors, wherein the second sub-cluster crossbar is connected to a second plurality of execution processors, wherein the first plurality of statically scheduled routing processors comprises a transmitting statically scheduled routing processor and a receiving statically scheduled routing processor,
wherein the first plurality of statically routing processors and the first plurality of execution processors are on the same system board.

2. The system board of claim 1, further comprising:
a first input/output buffer associated with a third one of the first plurality of statically scheduled routing processors.

3. The system board of claim 2, further comprising:
a second input/output buffer associated with a fourth one of the first plurality of statically scheduled routing processors, wherein the second input/output buffer is operatively connected to a host computer.

4. The system board of claim 2, wherein the first input/output buffer communicates with a second main cluster crossbar.

5. The system board of claim 1, further comprising:
a second main cluster crossbar connected to a second plurality of statically scheduled routing processors, wherein the second main cluster crossbar communicates with the first main cluster crossbar; and
a third sub-cluster crossbar associated with a first one of the second plurality of statically scheduled routing processors, wherein the third sub-cluster crossbar is connected to a third plurality of execution processors.

6. The system board of claim 5, further comprising:
a fourth sub-cluster crossbar associated with a second one of the second plurality of statically scheduled routing processors, wherein the fourth sub-cluster crossbar is connected to a fourth plurality of execution processors.

7. The system board of claim 5, wherein the first main cluster crossbar and the second main cluster crossbar are partitioned to perform computations for different simulations as defined by a simulation domain boundary.

8. The system board of claim 1, wherein at least one of the first plurality of execution processors comprises an execution unit capable of executing a simulation instruction.

9. The system board of claim 8, wherein the simulation instruction comprises a design logic instruction translated from a hardware description language source code.

10. The system board of claim 8, wherein the simulation instruction comprises a design logic instruction translated from a Verilog source code.

11. The system board of claim 8, wherein the simulation instruction comprises a design logic instruction translated from a register transfer language source code.

12. The system board of claim 1, further comprising:
a static random access memory interface associated with a third one of the first plurality of statically scheduled routing processors.

13. The system board of claim 1, further comprising:
a register file unit associated with a third one of the first plurality of statically scheduled routing processors.

14. The system board of claim 1, further comprising:
a global control register file unit associated with a third one of the first plurality of statically scheduled routing processors.

15. The system board of claim 1, wherein at least one of the first plurality of execution processors is temporally synchronized using an instruction.

16. The system board of claim 1, wherein at least one of the first plurality of execution processors is temporally synchronized using a global clock.

17. The system board of claim 1, wherein at least one of the first plurality of statically scheduled routing processors uses a routing table.

18. The system board of claim 1, wherein at least one of the first plurality of execution processors uses a register file.

19. The system board of claim 18, wherein the register file allows message packing.

20. The system board of claim 18, wherein the register file is bit addressable.

21. The system board of claim 1, wherein at least one of the first plurality of execution processors transmits and receives a tag identification.

22. The system board of claim 21, wherein the tag identification is verified by at least one of the first plurality of statically scheduled routing processors.

23. The system board of claim 1, further comprising:
a control network that operatively accesses a state of at least one of the first plurality of execution processors.

24. The system board of claim 23, wherein the state is altered by a control mode.

25. The system board of claim 1, further comprising:
an attention tree indicating when at least one of the first plurality of execution processors requires attention.

26. The system board of claim 1, wherein at least one of the first plurality of execution processors executes an instruction during a run mode.

27. The system board of claim 1, wherein at least one of the first plurality of execution processors comprises an error correction mechanism.

28. The system board of claim 1, wherein at least one of the first plurality of statically scheduled routing processors comprises an error correction mechanism.

29. The system board of claim 1, wherein the first sub-cluster crossbar provides communication between the first plurality of execution processors.

30. The system board of claim 1, wherein the first main cluster crossbar provides communication between the first sub-cluster crossbar and the second sub-cluster crossbar.

31. A system board comprising:
a first main cluster crossbar connected to a first plurality of statically scheduled routing processors, wherein the first plurality of statically scheduled routing processors are statically scheduled using routing information stored prior to run mode;
a first sub-cluster crossbar associated with a first one of the first plurality of statically scheduled routing processors, wherein the first sub-cluster crossbar is connected to a first plurality of execution processors;
a second sub-cluster crossbar associated with a second one of the first plurality of statically scheduled routing processors, wherein the second sub-cluster crossbar is connected to a second plurality of execution processors;
a second main cluster connected to a second plurality of statically scheduled routing processors, wherein the second main cluster crossbar communicates with the first main cluster crossbar;
a third sub-cluster crossbar associated with a first one of the second plurality of statically scheduled routing processors, wherein the third sub-cluster crossbar is connected to a third plurality of execution processors; and
a fourth sub-cluster crossbar associated with a second one of the second plurality of statically scheduled routing processors, wherein the fourth sub-cluster crossbar is connected to a fourth plurality of execution processors, wherein the first plurality of statically scheduled routing processors comprises a transmitting statically scheduled routing processor and a receiving statically scheduled routing processor,
wherein the first plurality of statically routing processors and the first plurality of execution processors are on the same system board.

32. A method of routing information on a system board comprising:
employing a first main cluster crossbar to communicate with a first plurality of statically scheduled routing processors, wherein the first plurality of statically scheduled routing processors are statically scheduled using routing information stored prior to run mode;
employing a first sub-cluster crossbar to communicate with a first plurality of execution processors,
wherein the first sub-cluster crossbar communicates with the first main cluster crossbar via a first one of the first plurality of statically scheduled routing processors; and
employing a second sub-cluster crossbar to communicate with a second plurality of execution processors, wherein the second sub-cluster crossbar communicates with the first main cluster crossbar via a second one of the first plurality of statically scheduled routing processors, wherein the first plurality of statically scheduled routing processors comprises a transmitting statically scheduled routing processor and a receiving statically scheduled routing processor,
wherein the first plurality of statically routing processors and the first plurality of execution processors are on the same system board.

33. The method of claim 32, further comprising:
communicating with a first input/output buffer via a third one of the first plurality of statically scheduled routing processors.

34. The method of claim 33, further comprising:
employing a second input/output buffer to communicate with a host computer, wherein the second input/output buffer communicates with the first main cluster crossbar via a fourth one of the first plurality of statically scheduled routing processors.

35. The method of claim 33, wherein the first input/output buffer communicates with a second main cluster crossbar.

36. The method of claim 32, further comprising:
employing a second main cluster crossbar to communicate with a second plurality of statically scheduled routing processors, wherein the second main cluster crossbar communicates with the first main cluster crossbar; and
employing a third sub-cluster crossbar to communicate with a third plurality of execution processors, wherein the third sub-cluster crossbar communicates with the second main cluster crossbar via a first one of the second plurality of statically scheduled routing processors.

37. The method of claim 36, further comprising:
employing a fourth sub-cluster crossbar to communicate with a fourth plurality of execution processors, wherein the fourth sub-cluster crossbar communicates with the second main cluster crossbar via a second one of the second plurality of statically scheduled routing processors.

38. The method of claim 36, wherein the first main cluster crossbar and the second main cluster crossbar are partitioned to perform computations for different simulations as defined by a simulation domain boundary.

39. The method of claim 32, wherein at least one of the first plurality of execution processors comprises an execution unit capable of executing a simulation instruction.

40. The method of claim 39, wherein the simulation instruction comprises a design logic instruction translated from a hardware description language source code.

41. The method of claim 39, wherein the simulation instruction comprises a design logic instruction translated from a Verilog source code.

42. The method of claim 39, wherein the simulation instruction comprises a design logic instruction translated from a register transfer language source code.

43. The method of claim 32, further comprising:
communicating with a static random access memory interface via a third one of the first plurality of statically scheduled routing processors.

44. The method of claim 32, further comprising:
communicating with a register file unit via a third one of the first plurality of statically scheduled routing processors.

45. The method of claim 32, further comprising:
communicating with a global control register file unit via a third one of the first plurality of statically scheduled routing processors.

46. The method of claim 32, wherein at least one of the first plurality of execution processors is temporally synchronized using an instruction.

47. The method of claim 32, wherein at least one of the first plurality of execution processors is temporally synchronized using a global clock.

48. The method of claim 32, wherein at least one of the first plurality of statically scheduled routing processors uses a routing table.

49. The method of claim 32, wherein at least one of the first plurality of execution processors uses a register file.

50. The method of claim 49, wherein the register file allows message packing.

51. The method of claim 49, wherein the register file is bit addressable.

52. The method of claim 32, wherein at least one of the plurality of execution processors transmits and receives a tag identification.

53. The method of claim 52, wherein the tag identification is verified by at least one of the first plurality of statically scheduled routing processors.

54. The method of claim 32, further comprising:
communicating with a control network that operatively accesses a state of the first plurality of execution processors.

55. The method of claim 54, wherein the state is altered by a control mode.

56. The method of claim 32, further comprising:
forming an attention tree, wherein the attention tree indicates when at least one of the first plurality of execution processors requires attention.

57. The method of claim 32, wherein at least one of the first plurality of execution processors executes an instruction during a run mode.

58. The method of claim 32, wherein at least one of the first plurality of execution processors comprises an error correction mechanism.

59. The method of claim 32, wherein at least one of the first plurality of statically scheduled routing processors comprises an error correction mechanism.

60. The method of claim 32, wherein the first sub-cluster crossbar provides communication between the first plurality of execution processors.

61. The method of claim 32, wherein the first main cluster crossbar provides communication between the first sub-cluster crossbar and the second sub-cluster crossbar.

62. A method of routing information on a system board comprising:
employing a first main cluster crossbar to communicate with a first plurality of statically scheduled routing processors, wherein the first plurality of statically scheduled routing processors are statically scheduled using routing information stored prior to run mode, and wherein the first plurality of statically scheduled routing processors comprises a transmitting statically scheduled routing processor and a receiving statically scheduled routing processor;
employing a first sub-cluster crossbar to communicate with a first plurality of execution processors, wherein the first sub-cluster crossbar communicates with the main cluster crossbar via a first one of the first plurality of statically scheduled routing processors;
employing a second sub-cluster crossbar to communicate with a second plurality of execution processors, wherein the second sub-cluster crossbar communicates with the main cluster crossbar via a second one of the first plurality of statically scheduled routing;
employing a second main cluster to communicate with a second plurality of statically scheduled routing processors, wherein the second main cluster crossbar communicates with the first main cluster crossbar;
employing a third sub-cluster crossbar to communicate with a third plurality of execution processors, wherein the third sub-cluster crossbar communicates with the second main cluster crossbar via a first one of the second plurality of statically scheduled routing processors; and
employing a fourth sub-cluster crossbar to communicate with a fourth plurality of execution processors, wherein the fourth sub-cluster crossbar communicates with the second main cluster crossbar via a second one of the second plurality of statically scheduled routing processors,
wherein the first plurality of statically routing processors and the first plurality of execution processors are on the same system board.

63. An apparatus for routing information on a system board comprising:
first means for communicating with a first plurality of statically scheduled routing processors, wherein the first plurality of statically scheduled routing processors are statically scheduled using routing information stored prior to run mode, and wherein the first plurality of statically scheduled routing processors comprises a transmitting statically scheduled routing processor and a receiving statically scheduled routing processor;

second means for communicating with a first plurality of execution processors, wherein the second means communicates with the first means via a first one of the first plurality of statically scheduled routing processors; and third means for communicating with a second plurality of execution processors, wherein the third means communicates with the first means via a second one of the first plurality of statically scheduled routing processors, wherein the first plurality of statically routing processors and the first plurality of execution processors are on the same system board.

* * * * *